US008098787B1

(12) United States Patent
Turudic (10) Patent No.: US 8,098,787 B1
(45) Date of Patent: Jan. 17, 2012

(54) METHOD AND APPARATUS FOR PRECISION QUANTIZATION OF TEMPORAL SPACING BETWEEN TWO EVENTS

(75) Inventor: Andy Turudic, Hillsboro, OR (US)

(73) Assignee: Altera Corporation, San Jose, CA (US)

( * ) Notice: Subject to any disclaimer, the term of this patent is extended or adjusted under 35 U.S.C. 154(b) by 1040 days.

(21) Appl. No.: 11/956,260

(22) Filed: Dec. 13, 2007

(51) Int. Cl.
*H03D 3/24* (2006.01)

(52) U.S. Cl. ........ 375/376; 375/327; 375/362; 375/371; 375/373; 375/375; 327/146; 327/147

(58) Field of Classification Search .................. 375/135, 375/295, 316, 327, 342, 359, 362, 371, 373, 375/376
See application file for complete search history.

(56) References Cited

U.S. PATENT DOCUMENTS

| 7,860,400 B2* | 12/2010 | Cole ............................. 398/155 |
| 2003/0212930 A1* | 11/2003 | Aung et al. ................... 714/700 |
| 2005/0122846 A1* | 6/2005 | Bolli et al. .................... 368/118 |
| 2005/0286507 A1* | 12/2005 | sterling et al. ................ 370/363 |
| 2006/0190756 A1* | 8/2006 | Okamura ....................... 713/503 |
| 2006/0203602 A1* | 9/2006 | Best et al. ..................... 365/233 |
| 2008/0143396 A1* | 6/2008 | Nishida .......................... 327/146 |

* cited by examiner

*Primary Examiner* — Shuwang Liu
*Assistant Examiner* — Hirdepal Singh
(74) *Attorney, Agent, or Firm* — Womble Carlyle Sandridge & Rice, LLP (57) ABSTRACT

One or two Serializer/Deserializer (SerDes) modules are used to measure the time between two pulses with high resolution. A PLL inside a SerDes block is locked to a reference clock and an input signal is passed through a storage element to create a serial data stream that is converted into a parallel data stream by a demultiplexer inside the SerDes. The parallel data is stored in a bit logic unit that compares the parallel data to a second parallel data obtained in similar fashion in another SerDes from a second input signal. The time between the two pulses is then calculated as the number of cycles in the serial data stream that corresponds to the number of bits between the positions of the two events.

20 Claims, 6 Drawing Sheets

METHOD AND APPARATUS FOR PRECISION QUANTIZATION OF TEMPORAL SPACING BETWEEN TWO EVENTS

BACKGROUND OF THE INVENTION

Different electronic devices have been used to measure the time between two electronic pulses, but solutions are expensive if the application requires high accuracy. Finding more flexible and inexpensive solutions would open new markets to a wider array of users and applications, such as ranging distance from an object to a vehicle, parking sensors to determine when vehicles are in a parking space, etc.

A Serializer/Deserializer (SerDes) is a pair of functional blocks commonly used in high speed communications. These blocks convert data between serial data and parallel interfaces in each direction. The generic SerDes has two functions, the Parallel-to-Serial converter, sometimes called the Parallel In Serial Out (PISO) block, and the Serial to Parallel converter, sometimes called the Serial In Parallel Out (SIPO) block. The SIPO block has a serial clock and data inputs. The serial clock may have been recovered from the data stream using a clock recovery technique. The SIPO block then divides the incoming clock down to the parallel rate.

SerDes are commonly embedded in many digital devices, or can be used as a separate electronic component. Using the embedded capabilities of the SerDes for processing digital inputs at a high rate to facilitate accurate time measurements would enable new applications requiring precise timing built at a lower cost. Therefore there is a need to use the high speed processing of digital input data embedded in the SerDes to quantify the time between two digital events, such as two pulses.

BRIEF SUMMARY OF THE INVENTION

Broadly speaking, the present invention fills these needs by providing a method of using two Serializer/Deserializer (SerDes) modules to measure time between two pulses with high resolution. A PLL inside a SerDes is locked to a reference clock and an input signal is sampled to create a serial data stream that is converted into a parallel data stream. The stored parallel data is then analyzed and compared with a second parallel data stream obtained in similar fashion from a second input signal, where the transition bits corresponding to the pulse edges are found. The time between the two pulses is then calculated as the number of cycles in the serial data stream that corresponds to the number of bits between the positions of the two pulses. It should be appreciated that the present invention can be implemented in numerous ways. Several inventive embodiments of the present invention are described below.

One embodiment includes an integrated circuit for measuring quantized time between two events that includes one or more SerDes. Each SerDes includes a Phase Locked Loop (PLL) locked to a reference clock that generates a first frequency used to clock the incoming serial data. The incoming signal is converted into a digital data stream by a storage unit using the first frequency. In addition, a frequency divider connected to the PLL generates a second frequency used to convert the serial data stream to a parallel data stream at a demultiplexer. The parallel data stream is then stored in a Transition Search State Machine (TSSM). Bit analysis logic unit then checks the parallel data streams in two different TSSMs to find the events corresponding to a first pulse and a second pulse and then computes the time difference between the two events.

Practical applications include measuring speed with a police radar gun, synchronizing clocks in telecommunications, and ranging the distance to an object from an automobile. Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Two Serializer/Deserializer (SerDes) modules are used to measure the time between two pulses with high resolution. A PLL inside a SerDes is locked to a reference clock and an input signal is passed through a storage element to create a serial data stream that is converted into a parallel data stream by a demultiplexer inside the SerDes. The parallel data is stored in a bit logic unit that compares the parallel data to a second parallel data obtained in similar fashion in another SerDes from a second input signal. The time between the two pulses is then calculated as the number of cycles in the serial data stream that corresponds to the number of bits between the positions of the two events. These precise time measurements can be used in applications such as measuring speed of moving vehicles using a police radar gun, synchronizing clocks in a telecommunication environment, or ranging distance to an object from an automobile.

Figure 1:
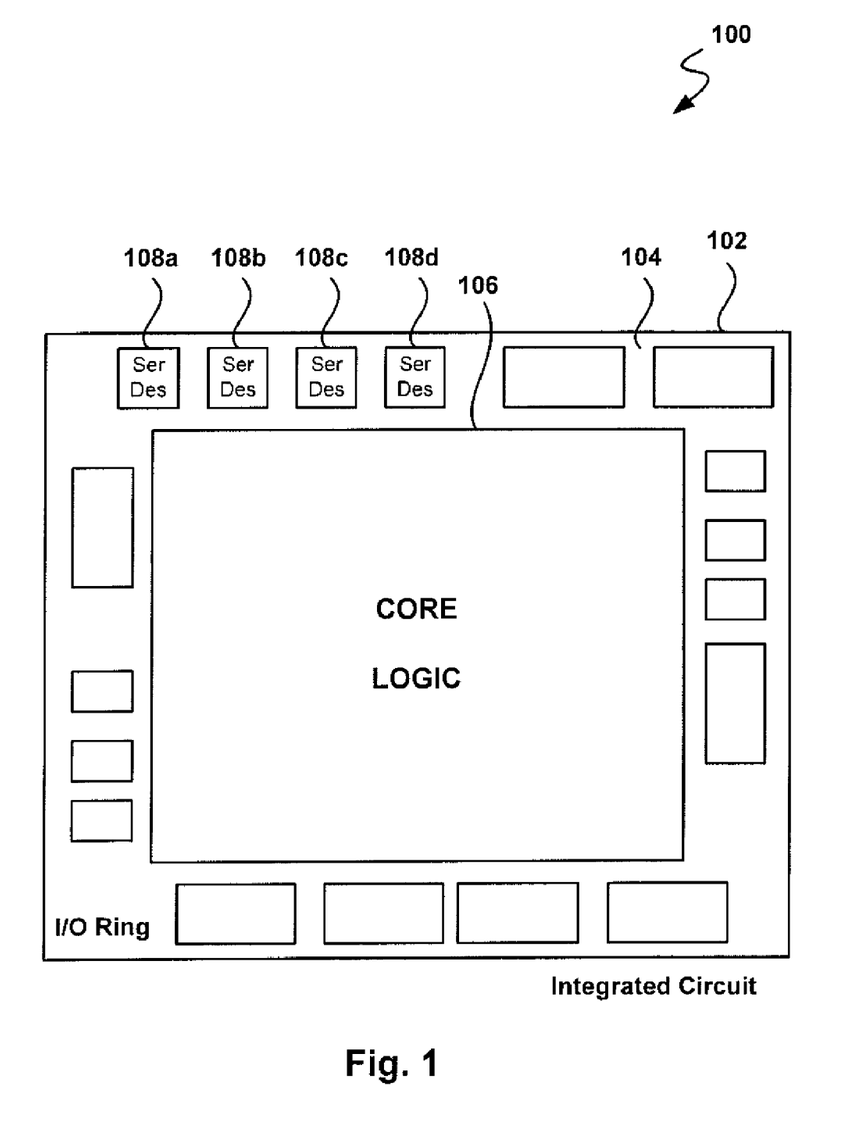
FIG. 1 depicts a plurality of embedded Serializer/Deserializer (SerDes) in an integrated circuit, according to one embodiment of the present invention.

FIG. 1 depicts one aspect of integrated circuit 102 that includes a plurality of embedded Serializer/Deserializers (SerDes) 108a, 108b, 108c, 108d according to one embodiment of the present invention. Integrated circuit 102 includes Input/Output (I/O) ring 104 and core logic 106. A number of components in I/O ring 104 manage data input and output for integrated circuit 102, including one or more SerDes 108a, 108b, 108c, 108d.

FIGS. 2A to 2D describe graphically some of the timing measurements performed by different embodiments of the current invention. An event in the context of the following embodiments refers to the occurrence of a certain sequence in the input data stream. For example, when looking at measuring time between two pulses, the first event can correspond to the beginning of the first pulse that translates into a transition from 0 to 1 (low to high) in the serial data stream. The second event, corresponding to the beginning of the second pulse, is detected as the first transition from 0 to 1 in the second serial data stream occurring after the first event. Besides a transition from 0 to 1, an event can be defined as a transition from 1 to 0, a certain pattern in the input data like 11110, a correlation between two input signals such as a time when both are 0, etc. A transition is a user defined sequence that corresponds to a desired pattern in the input data stream. For example, a transition can be defined as a 0 in a given bit and a 1 in the next bit, or a 1 in a given bit and a 0 in the next bit. It should be appreciated that transitions do not have to be limited to one bit changes and can include a series of bits. For example, a user may define a transition as the occurrence of the sequence 00001111. This would eliminate small transitions due to noise like 00001000, etc.

Figure 2A:
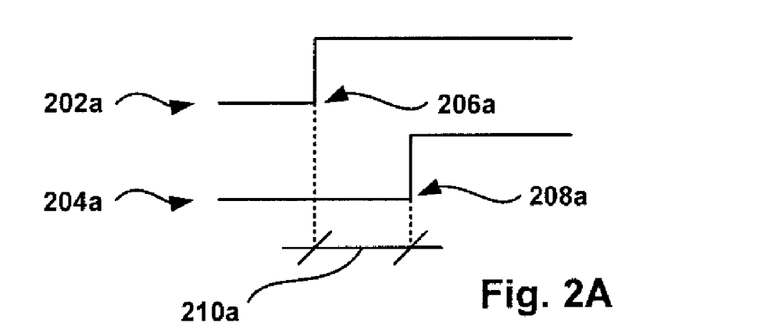
FIG. 2A shows graphically the measurement of time between two events, in accordance with one embodiment of the present invention.

FIG. 2A shows graphically the measurement of time 210a between two events, where the events in this case are two pulses. The first pulse enters through first input 202a, and the second pulse enters through second input 204a. At transition 206a, first input 202a changes from a logical low level to a logical high level and at posterior transition in time 208a, second input 204a also changes from low to high. Time measurement 210a is calculated as the time difference between transitions 206a and 208a.

Figure 2B:
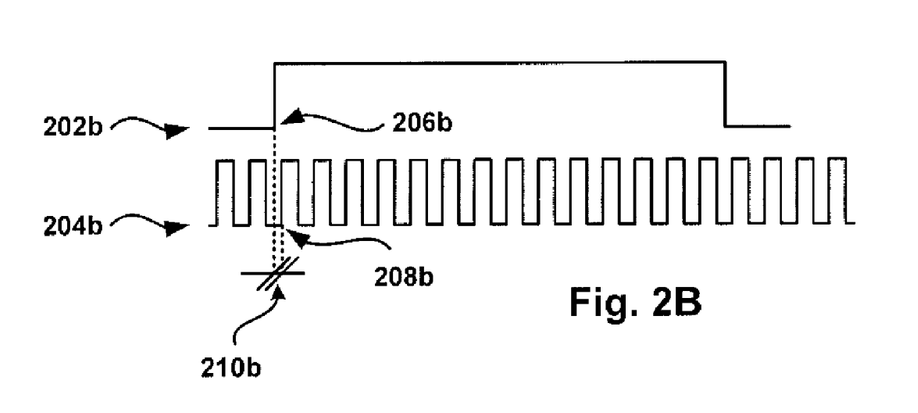
FIG. 2B shows the wave forms for the measurement of time between two pulses associated with high and low frequency inputs, in accordance with one embodiment of the present invention.

FIG. 2B shows the wave forms for the measurement of time 210b between two pulses associated with high and low frequency inputs. The first and second frequency pulses enter through first input 202b and second input 204b, respectively. First input 202b shows transition 206b at the front end of a pulse associated with the first frequency. Once first transition 206b is found, the system examines second input 204b until it finds a second transition 208b corresponding to the second frequency. Time measurement 210b is calculated as the difference transitions 206b and 208b.

Figure 2C:
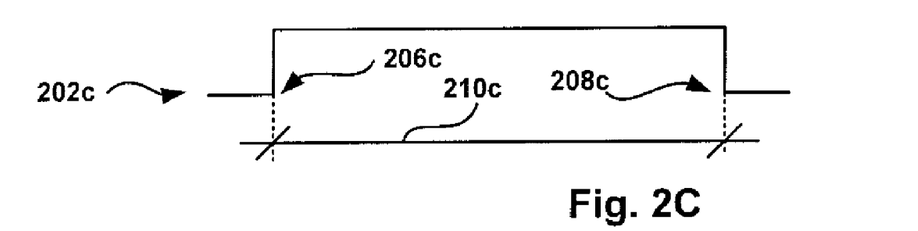
FIG. 2C shows the measurement of a pulse, in accordance with one embodiment of the present invention.

FIG. 2C shows the measurement of a pulse. The pulse enters through input 202c, and shows transition 206c at the front end of the pulse. The pulse has a posterior inverse transition 208c at the end of the pulse. Time measurement 210c of the pulse is calculated as the difference between transitions 206c and 208c.

Figure 2D:
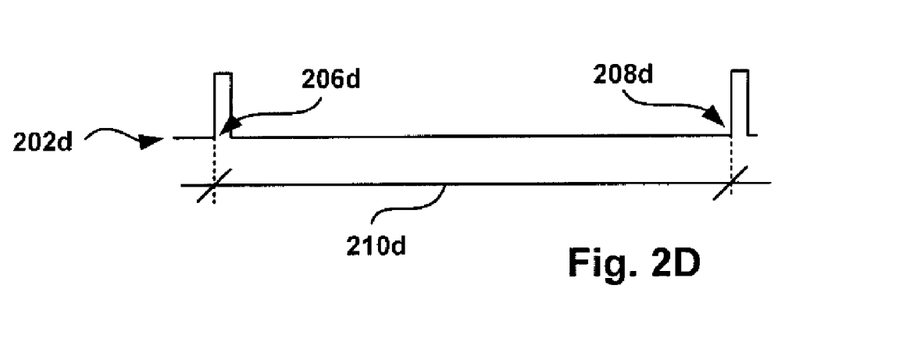
FIG. 2D depicts the measurement of time between two pulses in the same input signal, in accordance with one embodiment of the present invention.

FIG. 2D depicts the measurement of time between two pulses in the same input signal. The pulses enter through input 202d, showing first transition point 206d at the front end of the first pulse, and posterior transition 208d at the front end of the next pulse. Time measurement 210d of time between pulses is calculated as the difference between transitions 206d and 208d.

Figure 3:
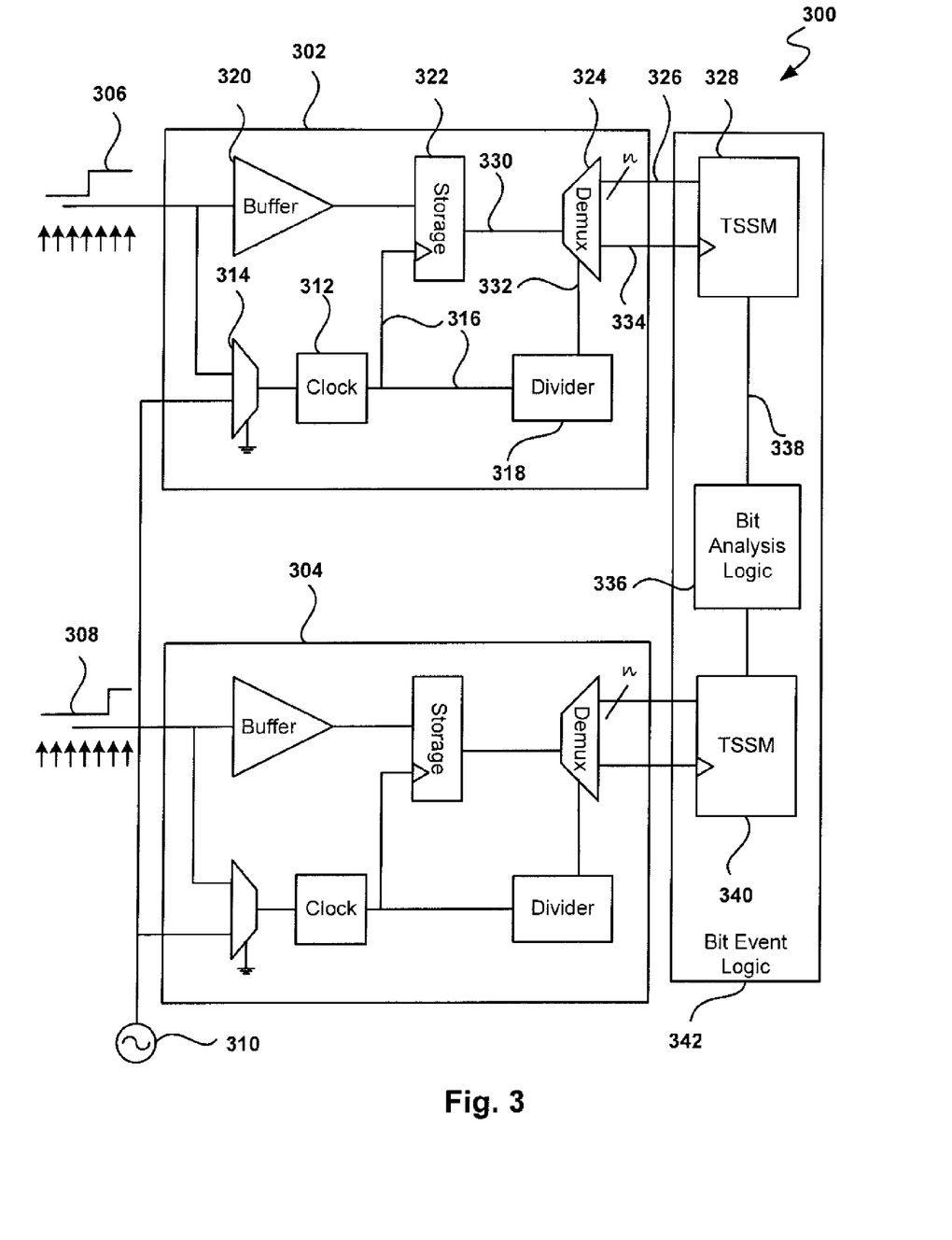
FIG. 3 shows the configuration of two SerDes for measuring time between two pulses in separate lines, in accordance with one embodiment of the present invention.

FIG. 3 depicts the configuration of two SerDes 302, 304 for measuring time between two pulses in separate lines, according to one embodiment of the present invention. Clock 312 in SerDes 302 is locked to a frequency generated by reference clock 310 by feeding clock 312 through frequency selector 314 that is permanently set to output the frequency generated by reference clock 310. For example, frequency selector 314 can be permanently set by grounding its select input. In one embodiment, clock 312 is a Phase Locked Loop (PLL). Clock 312 generates first frequency 316 that is inputted to both storage element 322 and frequency divider 318. The storage element 322 can be a flip-flop, a latch, etc. Frequency divider 318 generates a lower second frequency 332 that is inputted to demultiplexer 324. It should be noted that first frequency 316 is associated with the serial data rate of input 330 to the demultiplexer 324, while second frequency 332 is associated with parallel data rate 326 exiting demultiplexer 324. In another embodiment the clock is fixed.

First input 306 enters through buffer 320 that feeds storage element 322. In turn, storage element 322 outputs serial data stream 330 at a rate defined by first frequency 316. The demultiplexer 324 deserializes the serial data stream and creates parallel data stream 326 at the rate determined by second frequency 332. Parallel data stream 326 is stored in Transition Search State Machine (TSSM) 328, inside bit event logic unit 342, which operates at lower frequency 334. Second SerDes 304 operates in the same fashion as first SerDes 302, using the same first and second frequencies as in first SerDes 302. A detailed explanation of SerDes 304 is not provided for the sake of redundancy. Second input 308 then originates a second parallel data stream that is stored in second TSSM 340. Bit event logic 342 running in core 106 of integrated circuit 102 includes bit analysis logic 336 that calculates time difference 210a between first input 306 and second input 308 by examining the stored parallel data streams in the first and second TSSMs 328, 340 respectively, as discussed below (See FIG. 5).

In one embodiment the reference clock runs at 100 MHz, the first frequency is 6.4 Gbps, the second frequency is 200 MHz, and the parallel data stream has a width of 32 bits. It should be noticed that the sampling of the data is done at the high frequency of 6.4 Gbps, while the actual calculation of the time difference is done at the core at the lower frequency of 200 MHz.

Figure 4:
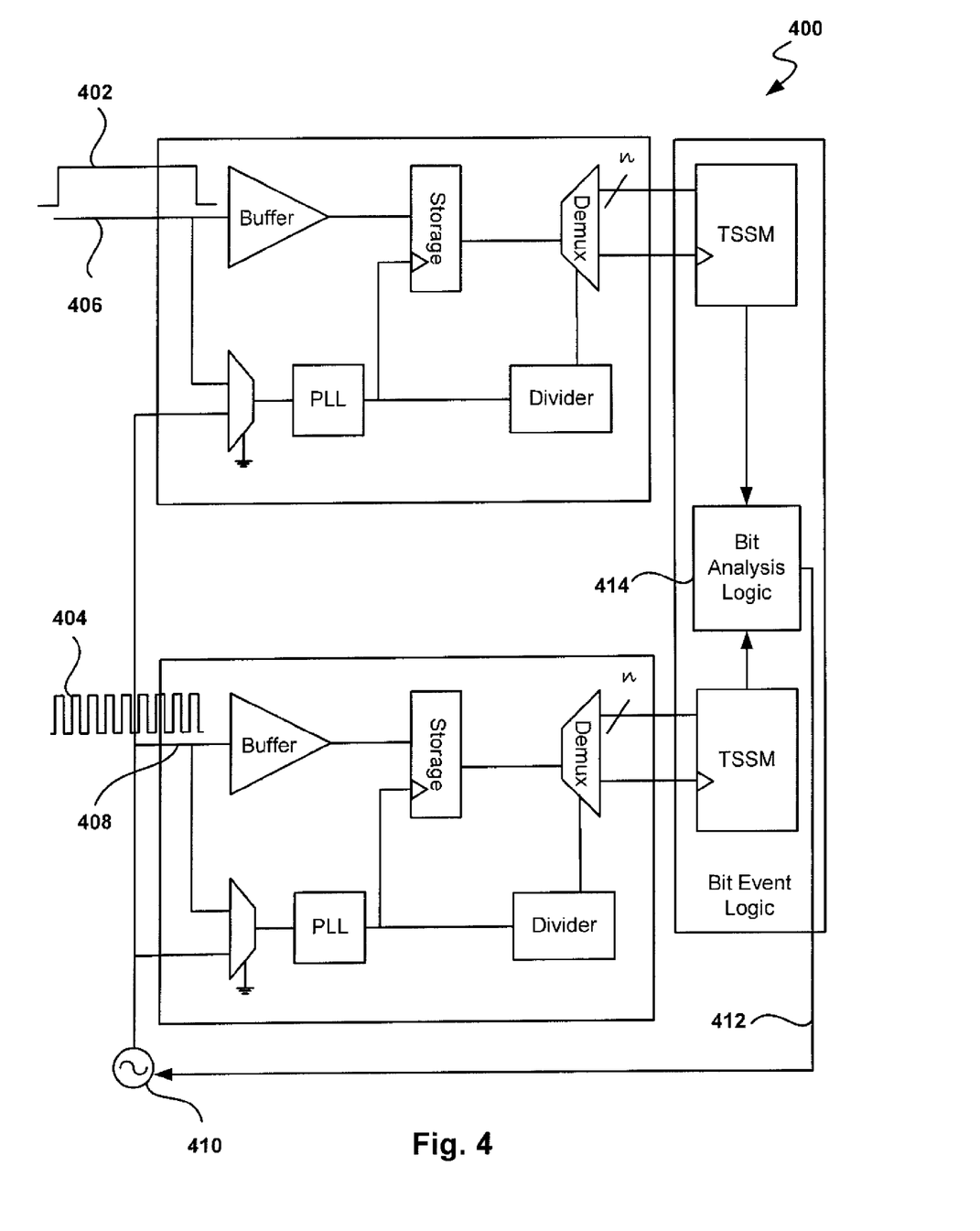
FIG. 4 shows a two SerDes configuration to synchronize a reference clock with a low frequency signal, in accordance with one embodiment of the present invention.

FIG. 4 shows a two SerDes configuration that synchronizes reference clock 410 with low frequency signal 402, where the two SerDes 302, 304 have the same configuration as previously discussed with reference to FIG. 3. In this case, first input 406 is a low frequency signal 402 and second input 408 is a high frequency signal 404 originated by reference clock 410. Bit analysis logic 414 calculates the time difference between the beginning of the first pulse and the beginning of the next pulse from the high frequency signal 404 (see FIG. 2B). Bit analysis logic 414 then uses clock feedback 412 to synchronize the reference clock signal with low frequency signal 402.

In one embodiment, low frequency signal 402 is generated by a Global Positioning System (GPS) satellite with a pulse length of one second. High frequency signal 404 is used in a Telecommunications environment and runs at 100 MHz. In some instances, signal 404 is divided down from 100 MHz. Over time high frequency signal 404 used to transmit data may lose synchronism with low frequency signal 402 originated by the GPS satellite. Bit analysis logic 414 calculates the difference between the beginning of the one second pulse, with the beginning of a pulse in the communications clock, and then adjusts reference clock 410 to re-synchronize with low frequency signal 402.

Figure 5:
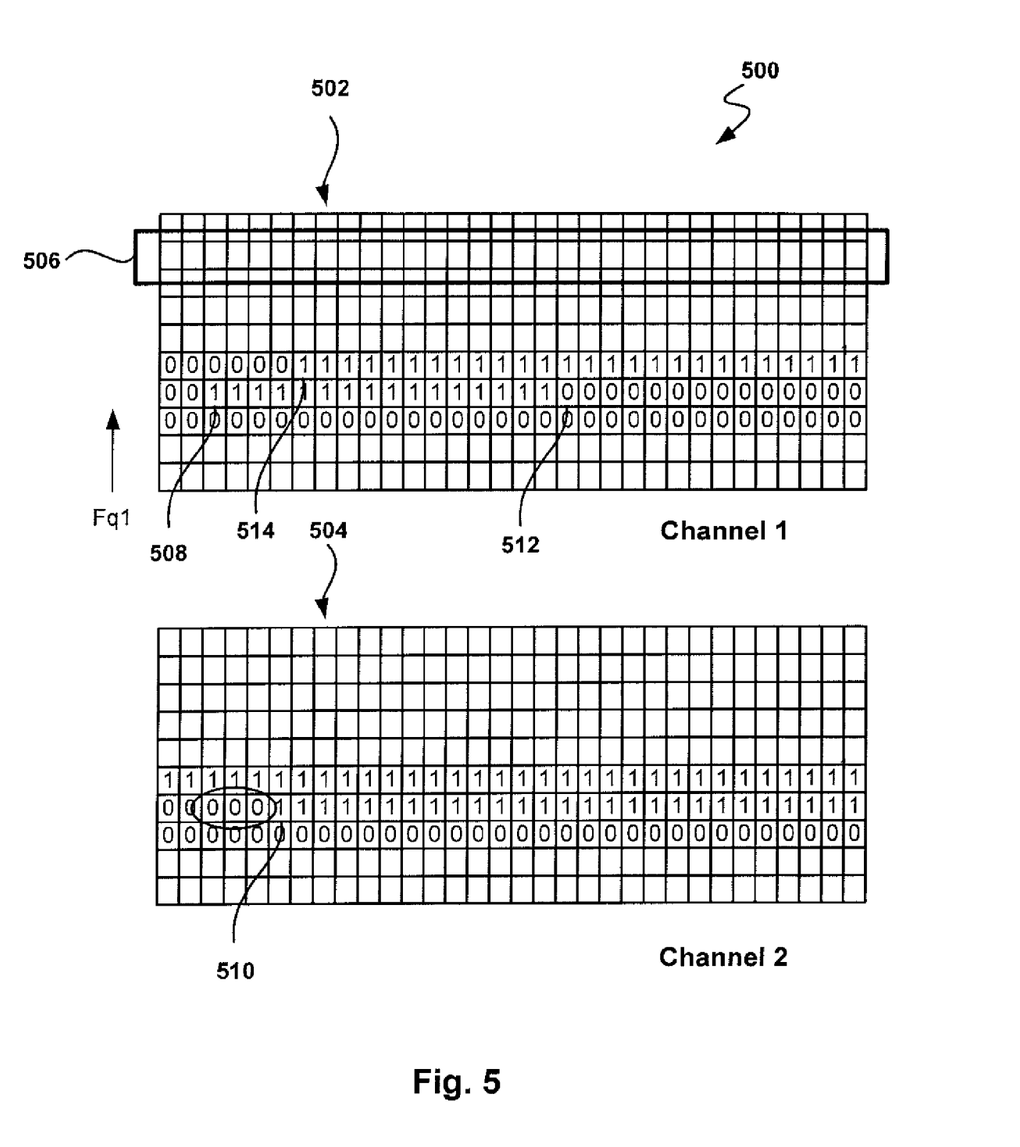
FIG. 5 depicts the storage of parallel data and event detection for several embodiments of the present invention.

FIG. 5 depicts the storage of the parallel data streams and several events. Parallel stream data 326 is stored in table 502 located in TSSM 328. For this example, each word 506 of parallel data stream 326 is stored in a row of table 502, and each word 506 contains 32 bits, with older data situated towards the bottom of table 502. Bit analysis logic 336 inspects the bits in the data sequentially, from left to right assuming that older bits corresponding to serial data stream 330 are on the left of newly transmitted bits. After inspecting the last bit in a given word, the next bit to be observed would be the first bit in the following word in time, in this figure, the word on top. At first transition bit 508 a transition is found from 0 in the previous bit to a 1 in the current bit. Bit analysis logics then starts inspecting second table 504, corresponding to second input 308, starting at the corresponding bit position of first transition bit 508. After three bits, second transition bit 510 is found, meaning that 3 clock cycles of the first frequency clock have elapsed between the two pulses.

In another embodiment, the length 210c of pulse 202c is calculated using one SerDes 302. The configuration of SerDes 302 is exactly the same as in FIG. 3, and only the information in table 502 is needed to calculate the pulse length. Bit analysis logic 336 starts inspecting bits until it reaches first transition bit 508 where the corresponding bit 1 is different from previous bit 0. Bit analysis logic then continues analyzing bits following transition bit 508 in the same word until it reaches high-to-low transition bit 512 with a transition from 1 to 0. Bit analysis logic 336 then calculates the difference in position of transition bits 512 and 508, in this case 16 bits, and the pulse length 210c corresponds to 16 cycles of the serial data stream clock 316.

In a different embodiment, the time between two pulses 210d of input signal 202d is calculated using one SerDes 302. Again, the configuration of SerDes 302 is exactly the same as in FIG. 3, and only the information in table 502 is needed to calculate the pulse length. Bit analysis logic 336 starts inspecting bits until it reaches first transition bit 508 where the corresponding bit 1 is different from previous bit 0. Bit analysis logic then continues analyzing bits following transition bit 508 in the same word looking for another 0 to 1 transition. After reaching the end of the word, the search continues in the next word (on top of the previous word in the drawing), until it reaches the second low-to-high transition bit 514. Bit analysis logic 336 then calculates the difference in position of transition bits 514 and 508, in our case 36 bits (29 bits in the first word plus 7 bits in the second word) and time between pulses 210d corresponds to 36 cycles of the serial data stream clock 316.

Figure 6:
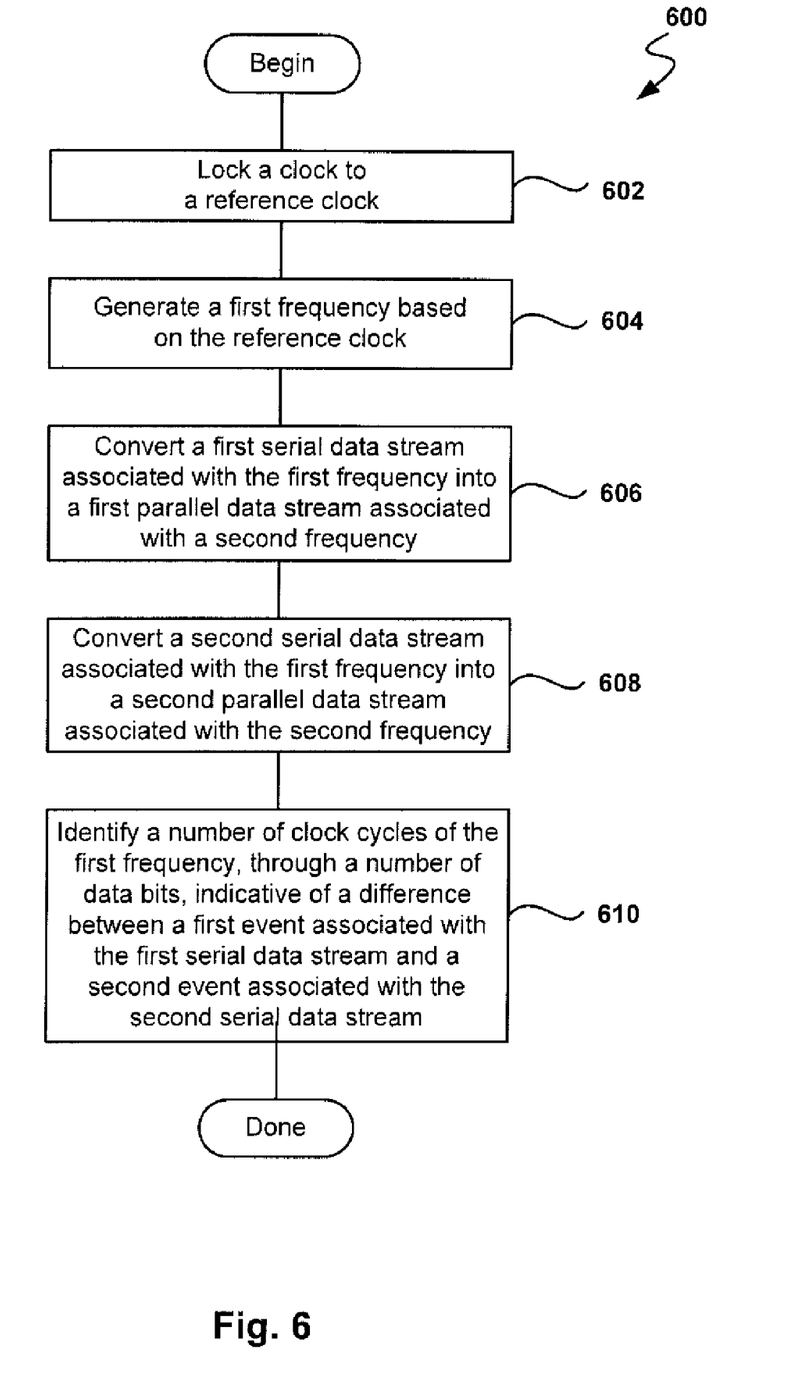
FIG. 6 shows a process flow 600 for measuring quantized time between two events, in accordance with one embodiment of the present invention.

FIG. 6 shows an embodiment of process flow 600 for measuring quantized time between two events, in accordance with the current invention. As discussed above, the method uses the capabilities of a SerDes to process a serial data stream at a high frequency, transforming it into a parallel data stream that can be processed at a lower speed at core 106.

At operation 602, a clock is locked to a reference clock. In one configuration, the clock can be a PLL. The PLL is locked to a reference clock by setting permanently the frequency selector to select the frequency generated by the reference clock, as illustrated in FIG. 3, instead of using the frequency derived from the input signal to the SerDes. By locking the PLL to a frequency, time measurements can be performed accurately as the frequency and phase of the clock remain constant. In the case where two SerDes are used to calculate timing differences between two signals, the output from both SerDes will be synchronized as both PLLs in the SerDes are locked to the same reference frequency. In another configuration, the clock can be a fixed clock since the method is oversampling.

At operation 604 a first frequency is generated based on the reference clock. The clock generates a high first frequency that allows the SerDes to sample the incoming signal at high speed, faster than the speed at the core of the integrated circuit, thereby allowing core logic 106 to measure time at a much finer resolution than if core logic 106 were to sample the incoming data. By storing the incoming data stream in parallel words, the core logic is able to do post-event analysis getting a finer time resolution than if the core logic were sampling the incoming signal at the speed core logic 106 runs.

At operation 606 a first serial data stream associated with the first frequency is converted into a first parallel data stream associated with a second frequency. At this operation the serial sampled data is converted into words that include a plurality of bits. Basically, for each clock cycle of the frequency at which the core runs a plurality of bits is stored corresponding to the input data during that core clock cycle. This gives the core the ability to get the finer sampling resolution as discussed above. In one embodiment, this is done by storing the serial input signal in a storage element that outputs bits at the rate determined by the first frequency.

At operation 608, a second serial data stream associated with the first frequency is converted into a second parallel data stream associated with the second frequency. The second SerDes 304 operates in similar fashion as first SerDes 302 and produces a second set of binary words associated with the second input.

At operation 610, a number of clock cycles of the first frequency indicative of a difference between a first event associated with the first serial data stream and a second event associated with the second serial data stream is identified. In this operation, the final calculation is done by the core logic (see FIG. 1) that looks at the stored data corresponding to the sampling of the two input signals. For example, in the case where the difference between two pulses in separate lines is being calculated, the bit analysis logic in the core checks bits sequentially in the words from the first parallel data stream until a beginning event bit is found, in this case the event is a transition from 0 to 1 that corresponds to a transition from low to high in the input signal. After the transition is found, the bits from the second parallel data stream are checked sequentially in the second table storing the second parallel data stream, starting at the corresponding position to the beginning event bit until an ending event bit is found. In this example, the ending event is characterized again by a transition from low to high in the second input signal. Finally, the time is measured as the number of cycles corresponding to the number of bits between the first and second events.

Other pattern recognition algorithms can be applied according to the nature of the problem. For example, a pulse transition can be defined as a 000111 pattern instead of a mere 01 sequence. In some cases, if the length of the pulse searched is expected to be at least a number n of bits, the search for the transition can be done at a coarse level by examining one every n/2 bits, or at any other sampling rate that allows detection of the pulse at a point in time where enough information is available to retrace steps and find exactly where the event happened. Once a transition sequence is detected, then the bit analysis logic examines the data one bit at a time to get to the fine resolution that the embodiment provides. In certain applications, the bit analysis logic can examine one or more bits per several words in the input stream allowing the bit analysis logic to search for events on-the-fly, and only after the occurrence of an event is determined will the bit analysis logic do a bit by bit search for the transition to calculate with high definition the timing of the event. In other applications, the parallel data stream will consist of a sequence of identical words until the desired event happens, for example words with all 0's while waiting for a transition to 1. In this case, core event logic can check the word in one step, e.g. by checking that the word is equal to binary 0, and continue until a change is detected. Once the change is detected, bit event logic will proceed to search for the transition bit or bits and calculate the time with the higher resolution.

The methods described here do not have to refer only to pulse detection, but can be applied in general to the search for any pattern in the data stream, or to relationships between two or more signals. For example, detecting when a signal differs from another for more than a threshold amount of time. In this case, the bit analysis logic will compare the corresponding bits of two data streams instead of comparing sequentially the bits in one data stream. In another example, the data stream can be originated by an analog signal by converting a voltage or current threshold into a binary signal.

These methods can be used in different applications. One example is the measurement of distance to an object by checking the traveling time of a signal to bounce off the object. Such practical applications include parking meter sensors that detect when a parking space is in use, a distance measuring device used in construction projects, etc. Another practical application is calculating the speed of a moving object by having two measurements of distance separated by a certain time interval and then calculating the object speed accordingly. This can be used for example in a police radar gun, or in military applications.

Another application is the regulation of a telecommunications clock. In one embodiment, a Global Positioning System (GPS) satellite sends one second pulses. These pulses must be synchronized with the communications clock of the incoming data stream. Furthermore, in applications that require analysis of a large amount of data corresponding to the input signal or signals, the parallel data stream or streams can be stored in permanent memory for post-event analysis. This memory can reside either in the core logic memory or in an external device. In other applications, more than two SerDes can be used to analyze and correlate information regarding multiple events and multiple signals.

In another embodiment, the method uses one SerDes only with the goal of determining some timing between events happening in one input signal. In this case, the bit analysis logic only examines the data stream from one channel, as discussed previously. Some applications include measuring the length of a pulse, measuring the time between pulses, measuring the frequency of a signal, or measuring the number of pulses in a certain period.

The embodiments, described herein may be employed with any integrated circuit, such as processors and programmable logic devices (PLDs). Exemplary PLDs include but are not limited to a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few. PLDs can have internal logic, assuming the functions of the bit event logic, and integrated SerDes resulting in more-compact and lower-cost solutions.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. The methods described before can be implemented with embedded SerDes or with external SerDes devices.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method comprising:
   locking a clock signal to a reference clock signal;
   generating a first frequency signal based on the reference clock signal;
   converting a first serial data stream associated with the first frequency signal into a first parallel data stream associated with a second frequency signal;
   converting a second serial data stream associated with the first frequency signal into a second parallel data stream associated with the second frequency signal;
   comparing a position of a beginning event bit in the first parallel data stream with a position of an ending event bit in the second parallel data stream, wherein the comparing comprises:
      sequentially checking bits from the first parallel data stream until the beginning event bit is found;
      determining a first position in the second parallel data stream that is contemporaneous to the beginning event bit;
      sequentially checking bits from the second parallel data stream starting at the first position until the ending event bit is found; and
      identifying a number of bits between the first position and the ending event bit; and
   identifying quantized time between the beginning event bit and the ending event bit in response to the comparing.

2. The method as recited in claim 1, wherein the converting a first serial data stream into a first parallel data stream associated with the second frequency signal comprises:
   storing serial data bits of the first serial data stream;
   serially outputting the stored bits at a rate of the first frequency signal; and
   transforming the serial output bits into the first parallel data stream at a rate of the second frequency signal.

3. The method as recited in claim 1, wherein the converting a first serial data stream is performed within a serializer/deserializer (SerDes).

4. The method as recited in claim 1, wherein identifying the quantized time is utilized to measure one of a time between events, a distance to an object, or a speed of a moving object, and wherein the identifying comprises determining a number of clock signal cycles associated with the number of bits between the first position and the ending event bit.

5. The method as recited in claim 1 further comprising:
   storing in permanent memory the first and second parallel data streams to facilitate post-event analysis.

6. The method as recited in claim 1, wherein additional serial data streams are analyzed together with the first and second serial data streams to calculate timing differences among the data streams.

7. The method as recited in claim 1, wherein an input frequency signal of the first serial data stream is less than an input frequency signal of the second serial data stream, wherein the input frequency signal of the second serial data stream is generated by the reference clock signal.

8. The method as recited in claim 7 further comprising: synchronizing the reference clock signal with the input frequency signal of the first serial data stream.

9. A method comprising:
locking a clock signal to a reference clock signal;
generating a first frequency signal based on the reference clock signal;
converting a first serial data stream associated with the first frequency signal into a first parallel data stream associated with a second frequency signal;
converting a second serial data stream associated with the first frequency signal into a second parallel data stream associated with the second frequency signal;
comparing a position of a beginning event bit in the first parallel data stream with a position of an ending event bit in the second parallel data stream; and
identifying quantized time between the beginning event bit and the ending event bit in response to the comparing, wherein the comparing comprises:
periodically sampling non-adjacent bits from the first parallel data stream until a first sample is found indicating that the beginning event bit is previous to the first sample;
sequentially checking bits from the first parallel data stream starting at a sample previous to the first sample until the beginning event bit is found;
determining a first position in the second parallel data stream that is contemporaneous to the beginning event bit;
periodically sampling non-adjacent bits from the second parallel data stream starting at the first position until a second sample is found indicating that the ending event bit is previous to the second sample;
sequentially checking bits from the second parallel data stream starting at a sample previous to the second sample until the ending event bit is found; and
identifying a number of bits between the first position and the ending event bit.

10. A method comprising:
locking a clock signal to a reference clock signal;
generating a first frequency signal based on the reference clock signal;
converting a serial data stream associated with the first frequency signal into a parallel data stream associated with a second frequency signal;
comparing a position of a beginning event bit in the parallel data stream with a position of an ending event bit in the parallel data stream, wherein the comparing comprises:
sequentially checking bits from the parallel data stream until the beginning event bit and the ending event bit are found; and
identifying a number of bits between the beginning event bit and the ending event bit; and
identifying quantized time between the beginning event bit and the ending event bit in response to the comparing.

11. The method as recited in claim 10, wherein the beginning event bit and the ending event bit correspond to opposing types of transitions in bit values of the parallel data stream.

12. The method as recited in claim 10, wherein the beginning event bit and the ending event bit correspond to equivalent types of transitions in bit values of the parallel data stream.

13. The method as recited in claim 10, wherein identifying the quantized time is utilized to measure a pulse duration, a frequency, or a number of pulses, and wherein the identifying comprises determining a number of clock signal cycles associated with the number of bits between the beginning event bit and the ending event bit.

14. The method as recited in claim 10, wherein the ending event bit is found after a predetermined pattern for a plurality of parallel data stream bits occurs.

15. The method as recited in claim 10, wherein the serial data stream is derived from an analog signal by converting a voltage or current threshold into a binary signal.

16. An integrated circuit comprising:
a Phase Locked Loop (PLL) operable to lock to a reference clock signal, the PLL operable to generate a first frequency signal;
a frequency divider coupled to the PLL, the frequency divider operable to generate a second frequency signal;
a demultiplexer coupled to the frequency divider, the demultiplexer operable to convert a serial data stream associated with the first frequency signal into a parallel data stream associated with the second frequency signal; and
bit event logic operable to receive the parallel data stream, the bit event logic operable to sequentially check bits from the parallel data stream to locate a beginning event bit and an ending event bit, and the bit event logic operable to identify quantized time between the beginning event bit and the ending event bit, wherein the bit event logic comprises:
a Transition Search State Machine (TSSM) operable to store the parallel data stream; and
bit analysis logic coupled to the TSSSM, the bit analysis logic operable to sequentially check bits from the parallel data stream, wherein the bit analysis logic is operable to output a difference in a position of the beginning event bit and a position of the ending event bit.

17. An integrated circuit as recited in claim 16, further comprising:
a storage element coupled to the PLL, the storage element operable to store data bits of the serial data stream, wherein the storage element is operable to output the stored bits at a rate of the first frequency signal, and wherein the demultiplexer is operable to transform the storage element output bits into the parallel data stream at a rate of the second frequency signal.

18. The integrated circuit as recited in claim 16, wherein the integrated circuit is a Programmable Logic Device (PLD).

19. The integrated circuit as recited in claim 16, wherein the PLL, the frequency divider, and the demultiplexer are part of a serializer/deserializer (SerDes).

20. The integrated circuit as recited in claim 19, wherein the bit event logic is operable to correlate events from a plurality of SerDes.

* * * * *